(12) United States Patent
Kono et al.

(10) Patent No.: US 12,739,526 B2
(45) Date of Patent: Sep. 15, 2026

(54) PHOTOELECTRIC CONVERSION DEVICE, PHOTOELECTRIC CONVERSION SYSTEM, AND MOVING BODY

(71) Applicant: CANON KABUSHIKI KAISHA, Tokyo (JP)

(72) Inventors: Shoji Kono, Tokyo (JP); Takanori Yamashita, Tokyo (JP); Satoshi Kumaki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 18/617,780

(22) Filed: Mar. 27, 2024

(65) Prior Publication Data

US 2024/0334074 A1 Oct. 3, 2024

(30) Foreign Application Priority Data

Mar. 31, 2023 (JP) ................................ 2023-059094

(51) Int. Cl.
*H04N 25/40* (2023.01)
*H04N 23/667* (2023.01)
*H04N 25/78* (2023.01)
*H10F 39/00* (2025.01)

(52) U.S. Cl.
CPC ........... *H04N 25/40* (2023.01); *H04N 23/667* (2023.01); *H04N 25/78* (2023.01); *H10F 39/811* (2025.01)

(58) Field of Classification Search
CPC ...... H04N 25/40; H04N 23/667; H04N 25/74; H10F 39/811
USPC ....................................................... 348/222.1
See application file for complete search history.

(56) References Cited

U.S. PATENT DOCUMENTS 8,530,989 B2 9/2013 Kikuchi
8,582,009 B2 11/2013 Kono
8,659,692 B2 2/2014 Matsuda
8,670,056 B2 3/2014 Kono
(Continued)

FOREIGN PATENT DOCUMENTS

JP 2011-082813 A 4/2011
JP 2011-193041 A 9/2011
(Continued)

OTHER PUBLICATIONS

Office Action dated Apr. 25, 2025, in Japanese Patent Application No. 2023-059094.
(Continued)

*Primary Examiner* — Lin Ye
(74) *Attorney, Agent, or Firm* — Venable LLP

(57) ABSTRACT

Photoelectric conversion device having pixels forming rows and columns, column signal lines, and read circuit for reading signals from the pixels via the column signal lines. The column signal lines include first signal lines and second signal lines for each column. The rows include first group rows forming first group, and second group rows forming second group. The read circuit performs first vertical scanning of reading signals of pixels in the first group rows via the first signal lines, and second vertical scanning of reading signals of pixels in the second group rows via the second signal lines, and the second vertical scanning is performed in period of the first vertical scanning. Electric conductor connected to none of the pixels in the period is arranged between the first signal lines and the second signal lines.

15 Claims, 10 Drawing Sheets

(56) References Cited

U.S. PATENT DOCUMENTS 8,687,246 B2 4/2014 Fujimura
8,710,610 B2 4/2014 Kono
8,717,471 B2 5/2014 Sato
8,742,359 B2 6/2014 Arishima
8,836,833 B2 9/2014 Yamashita
9,153,610 B2 10/2015 Kobayashi et al.
9,214,490 B2 * 12/2015 Yamaoka .............. H04N 25/78
9,445,026 B2 9/2016 Kobayashi et al.
9,502,451 B2 11/2016 Yamashita
9,653,498 B2 5/2017 Yamashita
9,749,570 B2 8/2017 Yamashita
10,021,328 B2 7/2018 Takada
10,026,762 B2 7/2018 Soda
10,051,223 B2 8/2018 Yamashita
10,057,529 B2 8/2018 Saito
10,298,867 B2 5/2019 Takada
10,536,675 B2 1/2020 Kumaki
10,638,066 B2 4/2020 Kobayashi
10,652,531 B2 5/2020 Kono
10,778,920 B2 9/2020 Yamashita
10,834,348 B2 11/2020 Yoshida et al.
11,070,753 B2 7/2021 Yamashita
11,082,642 B2 8/2021 Fukuhara
11,165,979 B2 11/2021 Nishikawa et al.
11,284,032 B2 3/2022 Shinohara
11,394,908 B2 7/2022 Akiyama
11,418,745 B2 8/2022 Yamashita
11,509,852 B2 11/2022 Suzuki
11,523,075 B2 12/2022 Suzuki
11,637,981 B2 4/2023 Yamashita
11,652,983 B2 5/2023 Kono
2006/0071252 A1 * 4/2006 Kondo ................. H10F 39/803 257/434
2008/0007638 A1 * 1/2008 Aoki ................... H04N 23/667 348/E5.081
2008/0258042 A1 * 10/2008 Krymski ............. H04N 25/767 348/E3.018
2009/0147117 A1 * 6/2009 Suzuki .................. H04N 25/00 348/294
2010/0066879 A1 * 3/2010 Tanaka ................ H04N 25/778 348/308
2010/0163711 A1 * 7/2010 Kondo ................ H04N 25/767 250/208.1
2011/0128426 A1 * 6/2011 Taruki ................... H04N 25/40 348/300
2011/0221941 A1 9/2011 Sato
2013/0182163 A1 * 7/2013 Kobayashi ............. H10F 39/80 348/302
2015/0062396 A1 * 3/2015 Yamaoka .............. H04N 25/78 348/302
2018/0332276 A1 * 11/2018 Hayashi ................ H04N 25/69
2023/0179881 A1 6/2023 Ohshitanai
2023/0292024 A1 9/2023 Ichino
2024/0031709 A1 1/2024 Ichino

FOREIGN PATENT DOCUMENTS

JP 2013-168634 A 8/2013
JP 2016-195186 A 11/2016
JP 2016-213795 A 12/2016
JP 2017-034508 A 2/2017
JP 2017-126925 A 7/2017
JP 2018-033072 A 3/2018
JP 2018-207100 A 12/2018
JP 2019-068267 A 4/2019
JP 2021-106360 A 7/2021
WO 2015/133323 A1 9/2015

OTHER PUBLICATIONS

Office Action dated Jan. 6, 2025, in Japanese Patent Application No. 2023-059094.

* cited by examiner 1200
1209
EXTERNAL I/F UNIT
COMPUTER
1210
RECORDING MEDIUM CONTROL I/F UNIT
1211
RECORDING MEDIUM
1206
BUFFER MEMORY UNIT
1208
GENERAL CONTROL/ ARITHMETIC UNIT
1216
SIGNAL PROCESSING UNIT
TIMING GENERATION UNIT
1217
1215
PHOTOELECTRIC CONVERSION DEVICE
1214
APERTURE
1213
1212

Figure 13A:
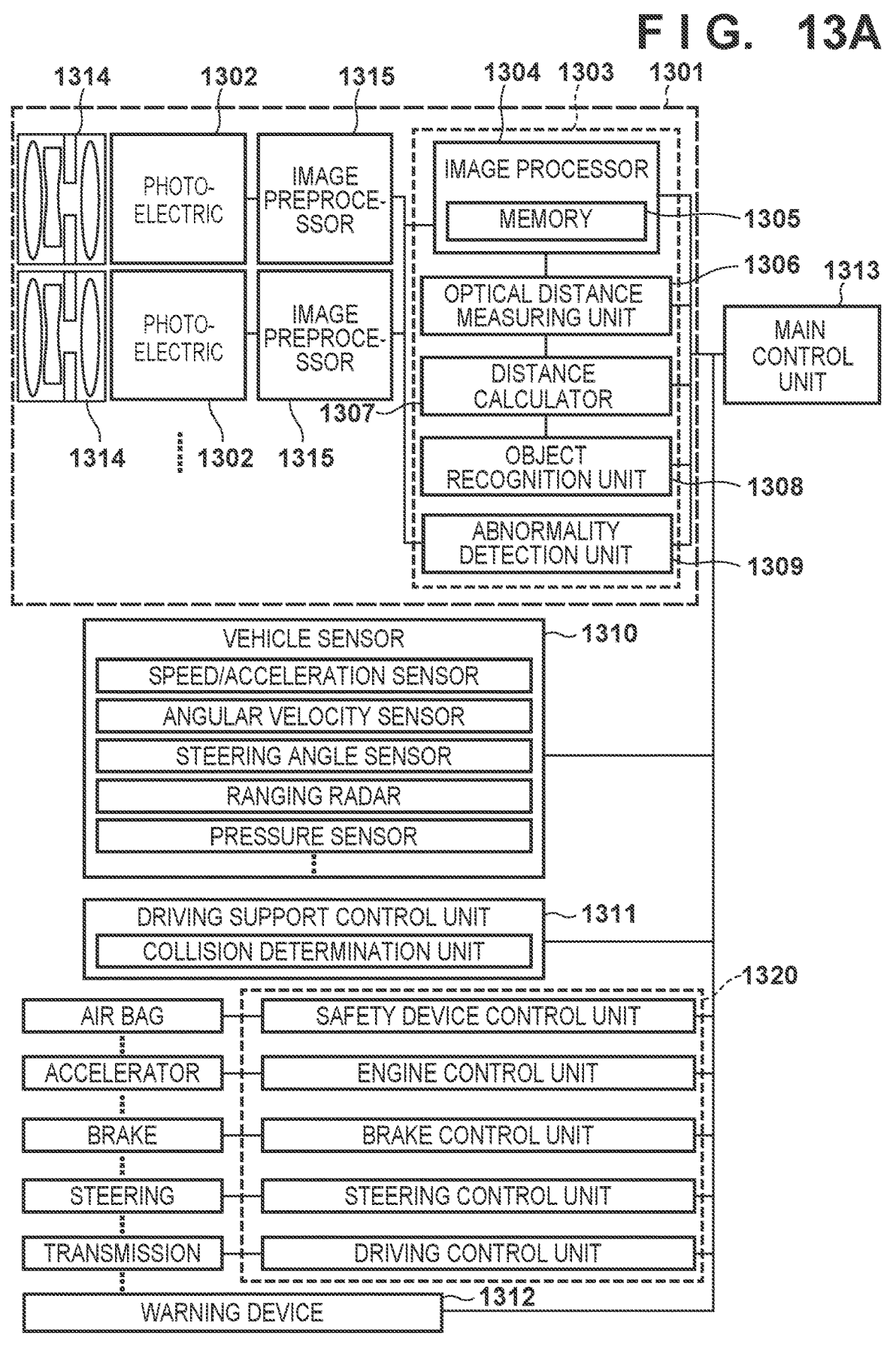

FIG. 13A 1314
1302
1315
1304
1303
1301
PHOTO-ELECTRIC
IMAGE PREPROCESSOR
IMAGE PROCESSOR
MEMORY
1305
1306
OPTICAL DISTANCE MEASURING UNIT
1313
MAIN CONTROL UNIT
PHOTO-ELECTRIC
IMAGE PREPROCESSOR
DISTANCE CALCULATOR
1307
1314
1302
1315
OBJECT RECOGNITION UNIT
1308
ABNORMALITY DETECTION UNIT
1309
VEHICLE SENSOR
1310
SPEED/ACCELERATION SENSOR
ANGULAR VELOCITY SENSOR
STEERING ANGLE SENSOR
RANGING RADAR
PRESSURE SENSOR
DRIVING SUPPORT CONTROL UNIT
1311
COLLISION DETERMINATION UNIT
1320
AIR BAG
SAFETY DEVICE CONTROL UNIT
ACCELERATOR
ENGINE CONTROL UNIT
BRAKE
BRAKE CONTROL UNIT
STEERING
STEERING CONTROL UNIT
TRANSMISSION
DRIVING CONTROL UNIT
WARNING DEVICE
1312

PHOTOELECTRIC CONVERSION DEVICE, PHOTOELECTRIC CONVERSION SYSTEM, AND MOVING BODY

BACKGROUND OF THE INVENTION

Field of the Invention

The present invention relates to a photoelectric conversion device, a photoelectric conversion system, and a moving body.

Description of the Related Art

Japanese Patent Laid-Open No. 2018-33072 describes an arrangement in which two signal lines are arranged so as to correspond to each pixel column, one signal line is connected to pixels belonging to odd-numbered rows, and the other signal line is connected to pixels belonging to even-numbered rows. One of two column signal lines arranged in each pixel column is used to obtain sensing information, and the other is used to obtain a display image.

In a photoelectric conversion device in which a plurality of pixels are arranged so as to form a plurality of rows and a plurality of columns, in order to increase the speed of reading out signals from the plurality of pixels, it is advantageous to arrange two or more column signal lines in each column. However, in the device described in Japanese Patent Laid-Open No. 2018-33072, crosstalk can occur, through a parasitic capacitance, between the signal line for obtaining a display image and the signal line for obtaining a sensing image.

SUMMARY OF THE INVENTION

The present invention provides a technique advantageous in reducing noise components generated by crosstalk which occurs between a plurality of signal lines arranged in each column.

One of aspects of aspects of the present invention provides a photoelectric conversion device comprising a plurality of pixels arranged so as to form a plurality of rows and a plurality of columns, a plurality of column signal lines, and a read circuit configured to read out signals from the plurality of pixels via the plurality of column signal lines, wherein the plurality of column signal lines include a plurality of first signal lines and a plurality of second signal lines for each of the plurality of columns, the plurality of rows include a plurality of first group rows forming a first group, and a plurality of second group rows forming a second group, the read circuit performs first vertical scanning of reading out signals of pixels in the plurality of first group rows via the plurality of first signal lines in each column, and second vertical scanning of reading out signals of pixels in the plurality of second group rows via the plurality of second signal lines in each column, and the second vertical scanning is performed in a period from a start of the first vertical scanning to an end of the first vertical scanning, and an electric conductor, which is electrically connected to none of the plurality of pixels in the period from the start of the first vertical scanning to the end of the first vertical scanning, is arranged between the plurality of first signal lines and the plurality of second signal lines.

Further features of the present invention will become apparent from the following description of exemplary embodiments with reference to the attached drawings.

BRIEF DESCRIPTION OF THE DRAWINGS

FIGS. 13A and 13B are views exemplarily showing the arrangement of a moving body.

DESCRIPTION OF THE EMBODIMENTS

Figure 1:
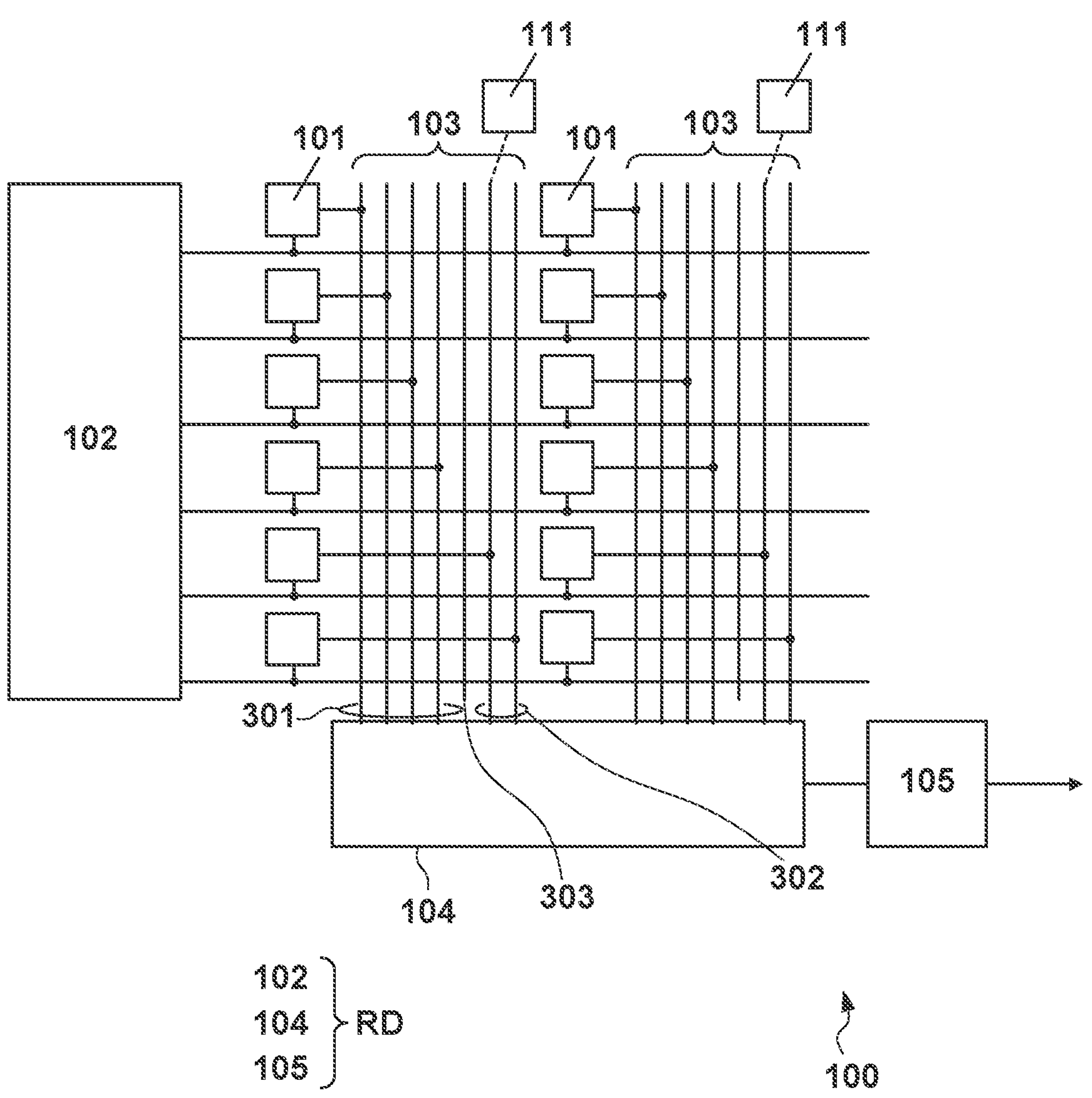
FIG. 1 is a plan view showing the arrangement of a photoelectric conversion device according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 schematically shows the arrangement of a photoelectric conversion device 100 according to the first embodiment of the present disclosure. The photoelectric conversion device 100 can be formed as, for example, an image sensing device or an image sensor. The photoelectric conversion device 100 can include a plurality of pixels 101 arranged so as to form a plurality of rows and a plurality of columns. The plurality of pixels 101 may be understood to form a pixel array formed by the plurality of rows and the plurality of columns. FIG. 1 shows only 12 pixels 101 arranged so as to form six rows×two columns, but in practice, more pixels 101 can be arranged so as to form more rows and more columns. In the following description, a "row" means a row formed by the plurality of pixels 101, and a "column" means a column formed by the plurality of pixels 101.

The photoelectric conversion device 100 can further include a plurality of column signal lines 103, and a read circuit RD that reads out signals from the plurality of pixels 101 via the plurality of column signal lines 103. The read circuit RD can include a vertical scanning circuit 102, a first signal processing circuit 104, and a second signal processing circuit 105. The vertical scanning circuit 102 scans the plurality of pixels 101 (pixel array formed thereby) in the vertical direction. More specifically, the vertical scanning circuit 102 selects the plurality of rows formed by the plurality of pixels 101 in a preset order according to a preset rule, and causes the pixel 101 in the selected row to output a signal to the corresponding column signal line 103. The pixel 101 in the selected row may be understood as the selected pixel 101. The first signal processing circuit 104 reads out signals output from the pixels 101 in the selected row via the plurality of column signal lines 103. The first signal processing circuit 104 may include an AD converter that AD-converts the signals output from the pixels 101 in the selected row via the plurality of column signal lines 103. The second signal processing circuit 105 can process and output the signal read out from the pixels 101 in the selected row by the first signal processing circuit 104.

In the photoelectric conversion device 100, two or more column signal lines 103 are assigned to each of the plurality of columns. In the example shown in FIG. 1, six column signal lines 103 are assigned to each column. Accordingly, in the example shown in FIG. 1, the read circuit RD (first signal processing circuit 104) can simultaneously read out signals of six pixels 101 for each column. In other words, in the example shown in FIG. 1, the read circuit RD (first signal processing circuit 104) can simultaneously read out signals of the pixels 101 in six rows.

The plurality of rows formed by the plurality of pixels 101 of the photoelectric conversion device 100 includes a plurality of first group rows forming a first group, and a plurality of second group rows forming a second group. The first group row means the row forming the first group. The second group row means the row forming the second group. The plurality of first group rows forming the first group are different from the plurality of second group rows forming the second group. The pixel 101 in the first group row can be used to, for example, generate a display image signal. The pixel 101 in the second group row can be used to, for example, generate a sensing image signal. Sensing can include obtaining phase difference information for focusing on an object (display target object), and obtaining light amount information for adjusting the exposure of the display target object. Note that the present invention is not limited to the above-described example. For example, the pixel in the first group row may be used as a pixel for video recording, and the pixel in the second group row may be used as a pixel for video display or monitor. Alternatively, for example, the pixel in the first group row may be used as a pixel for video display or recording, and the pixel in the second group row may be used as a pixel for motion detection.

Figure 2:
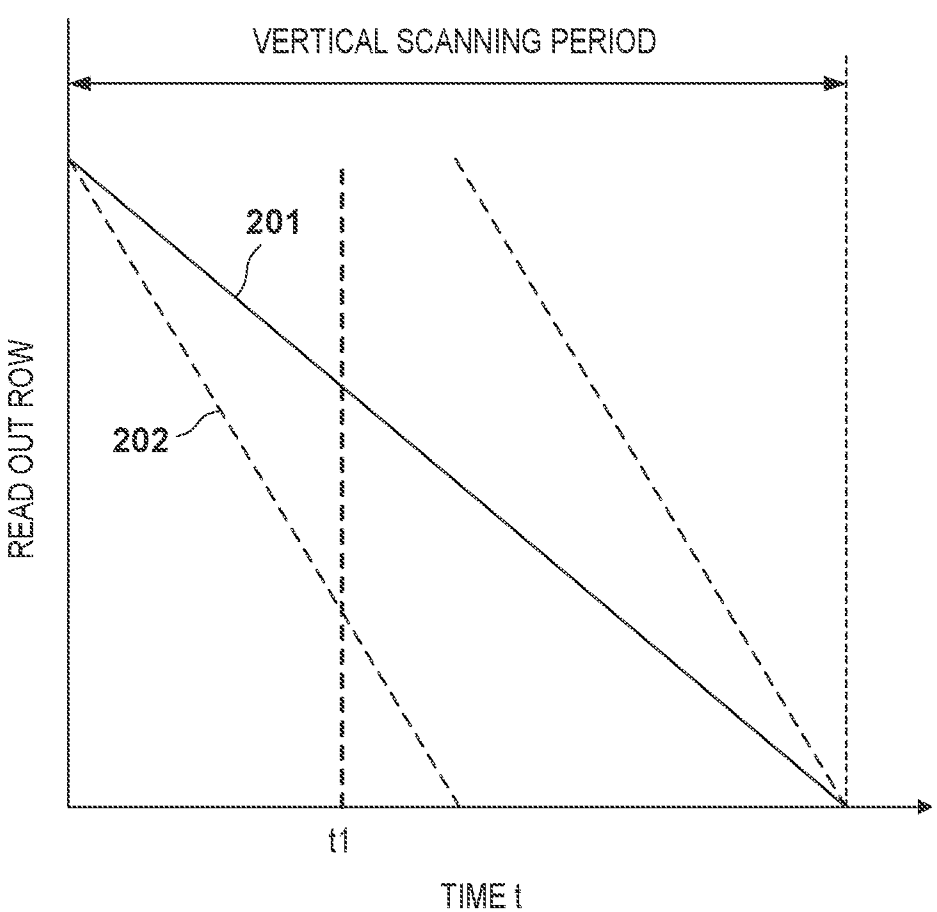
FIG. 2 is a view schematically showing vertical scanning in the photoelectric conversion device according to the first embodiment.

FIG. 2 schematically shows vertical scanning in the photoelectric conversion device 100 according to the first embodiment. A solid line 201 indicates vertical scanning for reading out display image signals from the pixels 101 in the plurality of first group rows, which is called first vertical scanning. A dashed line 202 indicates vertical scanning for reading out sensing image signals from the pixels 101 in the plurality of second group rows, which is called second vertical scanning. In the example shown in FIGS. 1 and 2, among the six column signal lines 103 provided for each column, four column signal lines 103 (to be also referred to as first signal lines 301 for the sake of discrimination) on the left are used to read out display image signals. Among the six column signal lines 103 provided for each column, two column signal lines 103 (to be also referred to as second signal lines 302 for the sake of discrimination) on the right are used to read out sensing image signals. In each column, each of the four column signal lines 103 (first signal lines 301) on the left is electrically connected to one of four pixels 101 selected from six pixels 101 arranged in different rows. Further, in each column, each of the two column signal lines 103 (second signal lines 302) on the right is electrically connected to one of the two remaining pixels 101 selected from the six pixels 101 arranged in different rows.

According to the arrangement as described above, it is possible to perform readout of display image signals from the pixels 101 in the plurality of first group rows and readout of sensing image signals from the pixels 101 in the plurality of second group rows simultaneously or in parallel. In another point of view, the second vertical scanning for reading out sensing image signals, which is indicated by the dashed line 202, can be performed in a period from the start of the first vertical scanning for reading out display image signals, which is indicated by the solid line 201, to the end of the first vertical scanning. In still another point of view, the first vertical scanning and the second vertical scanning can be performed in parallel.

Note that in this example, the number of the column signal lines 103 for reading out display image signals is larger than the number of the column signal lines 103 for reading out sensing image signals. However, on the contrary, the number of the column signal lines 103 for reading out display image signals may be smaller than the number of the column signal lines 103 for reading out sensing image signals. In this case, the first vertical scanning for reading out sensing image signals can be performed in a period from the start of the second vertical scanning for reading out display image signals to the end of the second vertical scanning. Alternatively, the number of the column signal lines 103 for reading out display image signals may be equal to the number of the column signal lines 103 for reading out sensing image signals.

In the example shown in FIG. 2, the number of the column signal lines 103 (second signal lines 302) for reading out sensing image signals is half the number of the column signal lines 103 (first signal lines 301) for reading out display image signals. Accordingly, in one vertical scanning period for reading out display image signals, sensing image signals can be read out twice from each of the pixels 101 for sensing.

In the example shown in FIG. 1, four pixels 101 consecutively arranged in the column direction are set as the pixels 101 for display, and two pixels 101 consecutively arranged in the column direction are set as the pixels 101 for sensing. However, the pixels 101 for sensing may be distributed and arranged among the pixels 101 for display. Such an arrangement is advantageous in increasing the resolutions of the display image and sensing image.

Here, consider a case in which one of the plurality of column signal lines 103 (first signal lines 301) for reading out display image signals and one of the plurality of column signal lines 103 (second signal lines 302) for reading out sensing image signals are arranged adjacent to each other. In this case, during a period in which the first vertical scanning for reading out display image signals and the second vertical scanning for reading out sensing image signals are performed in parallel, a timing occurs at which crosstalk between the first signal line 301 and the second signal line 302 adjacent to each other becomes a problem.

For example, at time t1 in FIG. 2, the row (pixel 101) to read out the display image signal is considerably far from the row (pixel 101) to read out the sensing image signal. Therefore, at time t1, it often happens that the sensing image signal is a high luminance signal and the display image signal is a low luminance signal. At time t1, if the first signal line 301 and the second signal line 302 are adjacent to each other, the sensing image signal and the display image signal can influence each other due to crosstalk between the first signal line 301 and the second signal line 302. Note that, since the plurality of first signal lines 301 are supplied with signals from the pixels 101 located at positions (rows) close to each other, their signal intensities are close, so that the influence of crosstalk is ignorable. Similarly, since the plurality of second signal lines 302 are supplied with signals from the pixels 101 located at positions (rows) close to each other, their signal intensities are close, so that the influence of crosstalk is ignorable.

Figure 3:
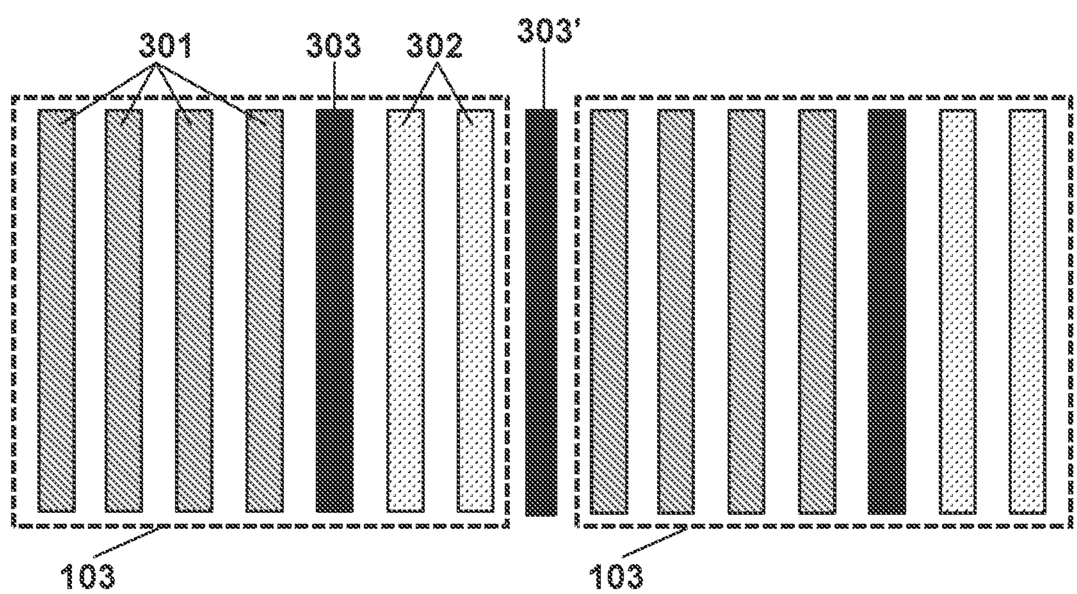
FIG. 3 is a plan view showing the arrangement of a plurality of column signal lines in each column according to the first embodiment.

FIG. 3 exemplarily shows the arrangement of the plurality of column signal lines 103 in each column. As has been described above, the plurality of column signal lines 103 include the plurality of first signal lines 301 and the plurality of second signal lines 302 for each of the plurality of columns formed by the plurality of pixels 101 of the photoelectric conversion device 100. The read circuit RD performs the first vertical scanning for reading out signals of the pixels 101 in the plurality of first group rows via the plurality of first signal lines 301 in each column, and the second vertical scanning for reading out signals of the pixels 101 in the plurality of second group rows via the plurality of second signal lines 302 in each column. The second vertical scanning is performed in the period from the start of the first vertical scanning to the end of the first vertical scanning. An electric conductor 303 is arranged between the plurality of first signal lines 301 and the plurality of second signal lines 302. The plurality of first signal lines 301 and the plurality of second signal lines 302 may be arranged in the same wiring layer, or may be arranged in different wiring layers. At least in the period from the start of the first vertical scanning to the end of the first vertical scanning, the electric conductor 303 is electrically connected to none of the plurality of pixels 101.

The electric conductor 303 may be supplied with a fixed potential from a potential supplier 111. As the potential supplier 111, for example, a dummy pixel, from which a signal is not read out at least in the period from the start of the first vertical scanning to the end of the first vertical scanning, can be used. The dummy pixel can be electrically connected to the electric conductor 303 at least in the period from the start of the first vertical scanning to the end of the first vertical scanning. Alternatively, as the potential supplier 111, for example, a potential supply line such as a power supply line or a ground line can be used. A switch is provided between the potential supplier 111 and the electric conductor 303, and a controller (not shown) (or the read circuit RD) may control the switch. In a period other than the period from the start of the first vertical scanning to the end of the first vertical scanning, the electric conductor 303 may be used as a signal line for transmitting signals.

The plurality of first signal lines 301 can be arranged alongside each other without intervening other conductive lines (the second signal line 302 and the electric conductor 303). The plurality of second signal lines 302 can be arranged alongside each other without intervening other conductive lines (the first signal line 301 and the electric conductor 303).

In the arrangement described above, the shortest distance between a first structure formed by the plurality of first signal lines 301 and a second structure formed by the plurality of second signal lines 302 is larger than the shortest mutual distance between the plurality of first signal lines 301 and the shortest mutual distance between the plurality of second signal lines 302. Such an arrangement is advantageous in reducing crosstalk between the plurality of first signal lines 301 and the plurality of second signal lines 302, particularly, crosstalk between the first signal line 301 and the second signal line 302 adjacent to each other. In addition, the electric conductor 303 is also advantageous in reducing crosstalk between the plurality of first signal lines 301 and the plurality of second signal lines 302, particularly, crosstalk between the first signal line 301 and the second signal line 302 adjacent to each other.

A second electric conductor 303' may be arranged between two columns adjacent to each other, in other words, between the plurality of column signal lines 103 in a given column and the plurality of column signal lines 103 in a column adjacent to the given column. The second electric conductor 303' may be supplied with, for example, a fixed potential from a second potential supplier (not shown) similar to the potential supplier 111. As the second potential supplier, for example, a dummy pixel, from which a signal is not read out at least in the period from the start of the first vertical scanning to the end of the first vertical scanning, can be used. The dummy pixel can be electrically connected to the second electric conductor 303' at least in the period from the start of the first vertical scanning to the end of the first vertical scanning. Alternatively, as the second potential supplier, for example, a potential supply line such as a power supply line or a ground line can be used. A switch is provided between the second potential supplier and the second electric conductor 303', and a controller (not shown) (or the read circuit RD) may control the switch. In a period other than the period from the start of the first vertical scanning to the end of the first vertical scanning, the second electric conductor 303' may be used as a signal line for transmitting signals.

Figure 4:
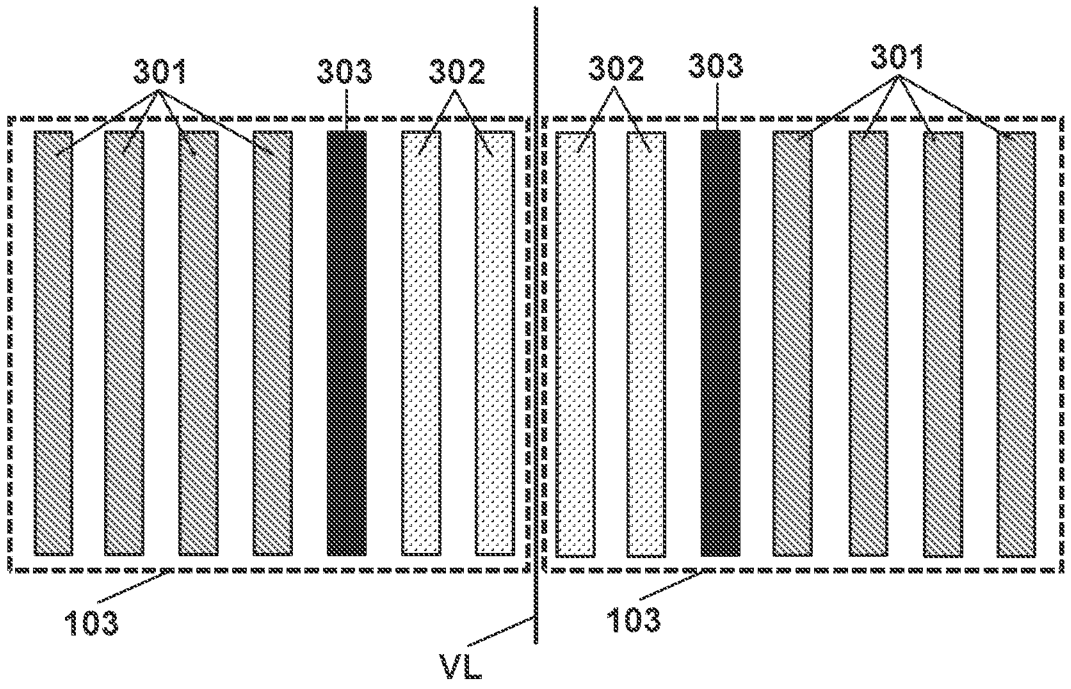
FIG. 4 is a plan view showing the arrangement of a plurality of column signal lines in each column according to the second embodiment.

With reference to FIG. 4, the arrangement of a photoelectric conversion device 100 according to the second embodiment will be described below. Matters not mentioned as the second embodiment can follow the first embodiment. FIG. 4 exemplarily shows the arrangement of a plurality of column signal lines 103 in each column of the photoelectric conversion device 100 according to the second embodiment.

In the second embodiment, in two columns adjacent to each other, the arrangement of a plurality of first signal lines 301 and a plurality of second signal lines 302 is line-symmetric with respect to a virtual line VL extending in the column direction between the two columns. That is, in the second embodiment, the plurality of second signal lines 302 in a given column are adjacent to the plurality of second signal lines 302 in an adjacent column without intervening the first signal line 301. Similarly, in the second embodiment, in two columns adjacent to each other, the plurality of first signal lines 301 in a given column (the right column in FIG. 4) are adjacent to the plurality of first signal lines 301 in the adjacent column (a column (not shown) on the right of the right column in FIG. 4) without intervening the second signal line 302.

In addition, in the second embodiment, no electric conductor (corresponding to the second electric conductor 303' in the first embodiment) is arranged between two columns, that is, between the second signal line 302 in the column on the left of the virtual line VL and the second signal line 302 in the column on the right of the virtual line VL in FIG. 4. However, in the second embodiment, the second signal lines 302 or the first signal lines 301 are adjacent to each other between two columns. That is, the second signal lines 302 for reading out sensing image signals or the first signal lines 301 for reading out display image signals are adjacent to each other between two columns. Hence, in the second embodiment, a problem of crosstalk between two columns is allowable. The arrangement in which no electric conductor is arranged between two columns is effective in reducing the entire area of the photoelectric conversion device 100.

Figure 5:
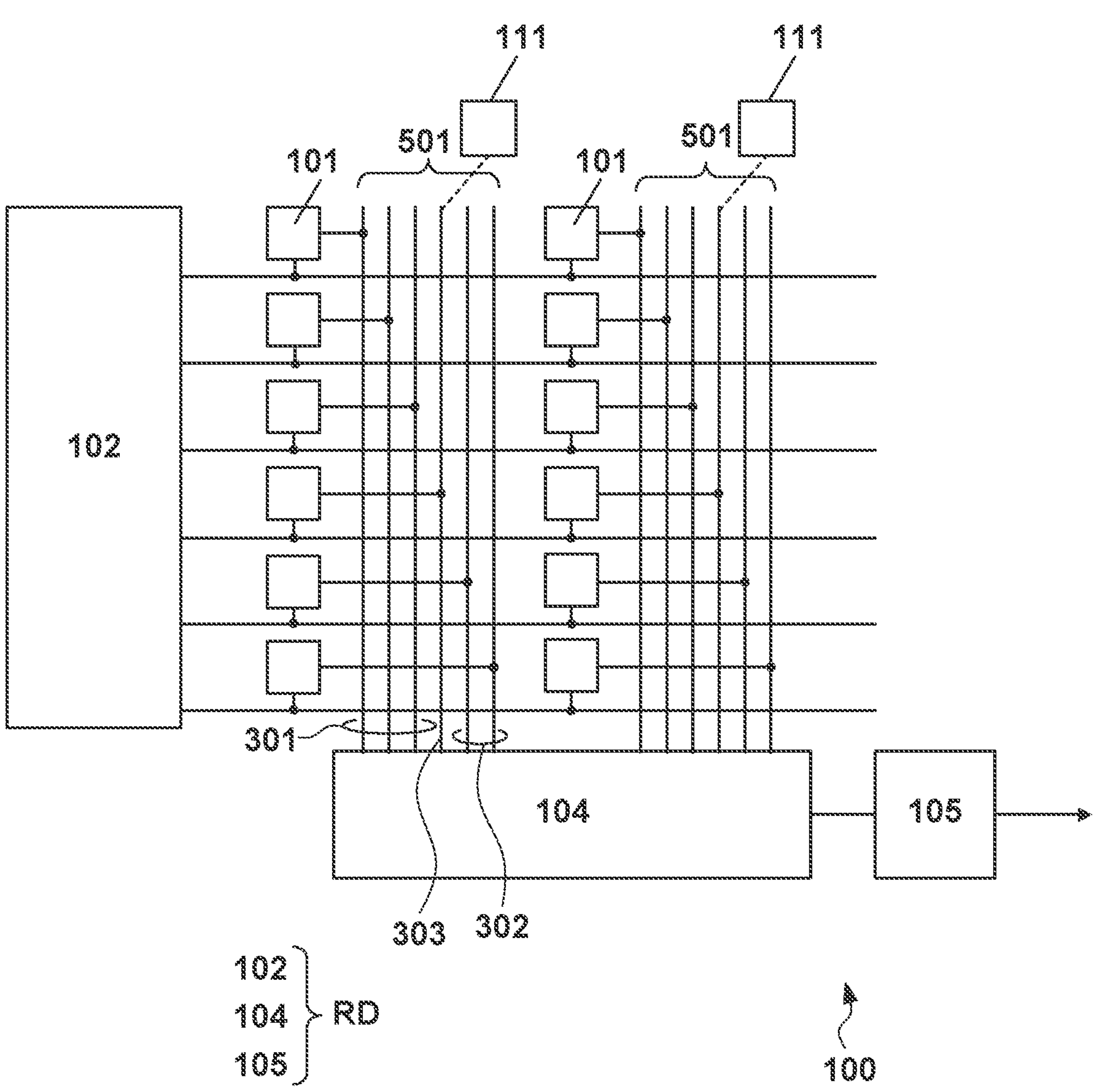
FIG. 5 is a plan view showing the arrangement of a photoelectric conversion device according to the third embodiment.
Figure 6:
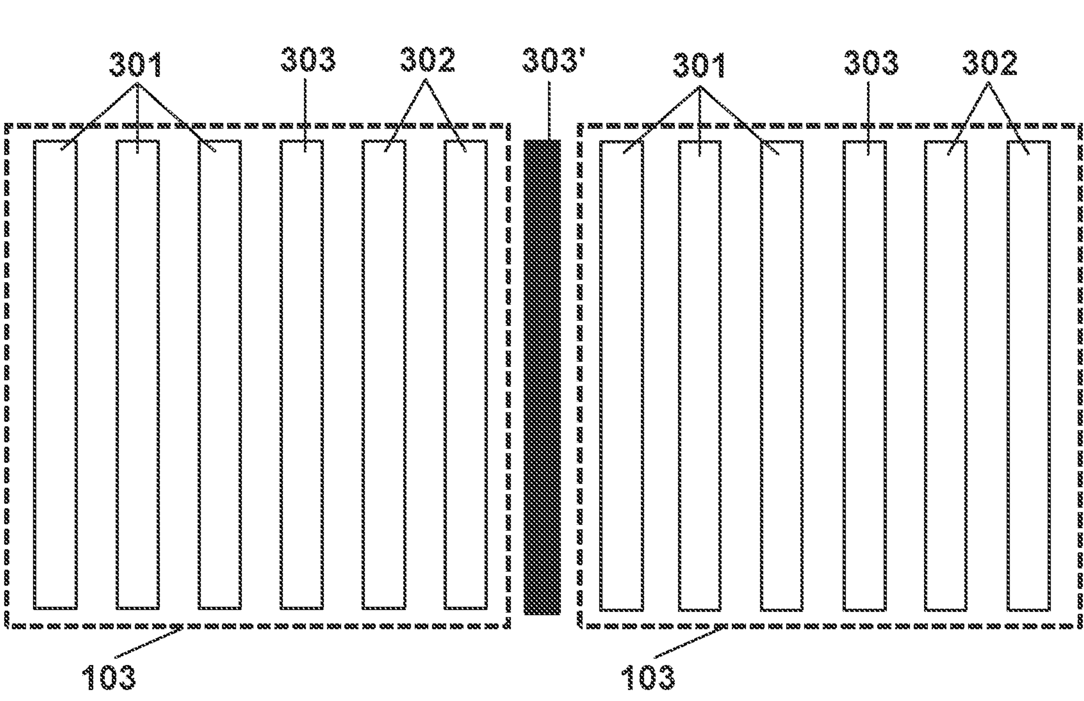
FIG. 6 is a plan view for explaining signal readout in the photoelectric conversion device according to the third embodiment.
Figure 7:
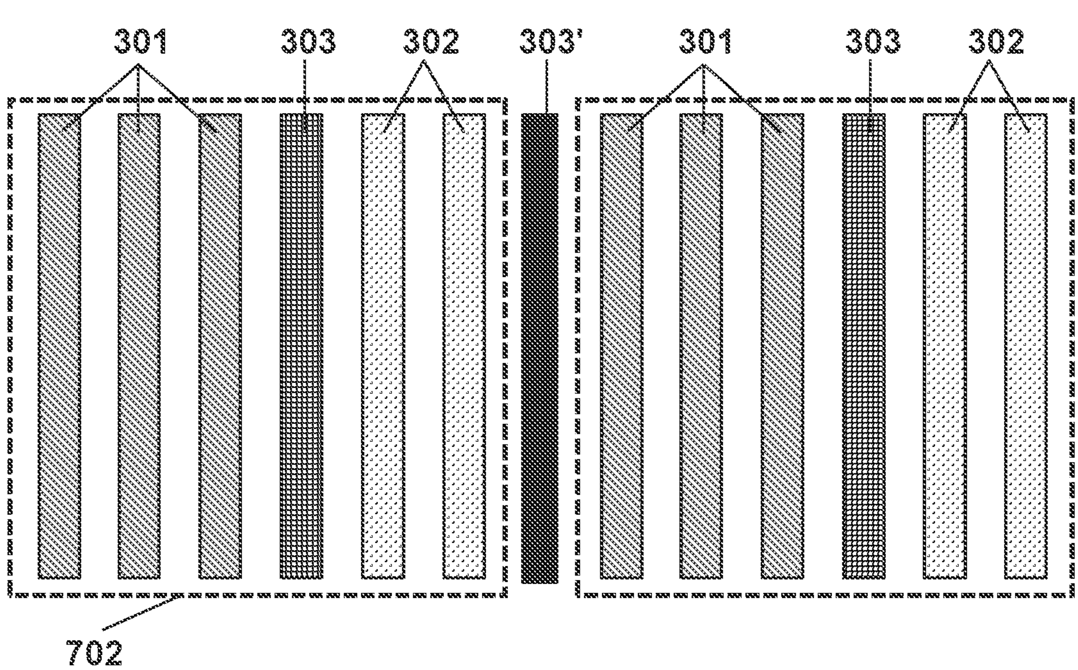
FIG. 7 is a plan view for explaining signal readout in the photoelectric conversion device according to the third embodiment.

With reference to FIGS. 5 to 7, the arrangement of a photoelectric conversion device 100 according to the third embodiment will be described below. Matters not mentioned as the third embodiment can follow the first embodiment. FIG. 5 exemplarily shows the arrangement of a plurality of column signal lines 103 in each column of the photoelectric conversion device 100 according to the third embodiment. The photoelectric conversion device 100 according to the third embodiment can operate in one of a plurality of modes including a first mode and a second mode. FIG. 6 schematically shows an operation in the first mode, and FIG. 7 schematically shows an operation in the second mode.

In the first mode, an electric conductor 303 in each column is used as a third signal line used by a read circuit RD to read out signals of pixels in a row different from a plurality of first group rows and a plurality of second group rows. In the second mode, the electric conductor 303 in each column is used as a shield between the plurality of first signal lines 301 and the plurality of second signal lines 302. In the second mode, the read circuit RD performs first vertical scanning, and performs second vertical scanning in a period from the start of the first vertical scanning to the end of the first vertical scanning. The operation in the second mode is a function similar to that in the first embodiment. In the second mode, for example, a potential supplier 111 can be electrically connected to the electric conductor 303, and a fixed potential can be supplied from the potential supplier 111 to the electric conductor 303.

The first mode can also be understood as a mode in which the electric conductor 303 serving as the third signal line is used by the read circuit RD to read out signals from at least some of a plurality of pixels 101 in a vertical scanning period. The second mode can also be understood as a mode in which the electric conductor 303 serving as the third signal line is electrically connected to none of the plurality of pixels 101 in a vertical scanning period.

As the potential supplier 111, for example, a dummy pixel, from which a signal is not read out at least in the period from the start of the first vertical scanning to the end of the first vertical scanning, can be used. The dummy pixel can be electrically connected to the electric conductor 303 at least in the period from the start of the first vertical scanning to the end of the first vertical scanning in the second mode. Alternatively, as the potential supplier 111, for example, a potential supply line such as a power supply line or a ground line can be used. A switch is provided between the potential supplier 111 and the electric conductor 303, and a controller (not shown) (or the read circuit RD) may control the switch.

Figure 8:
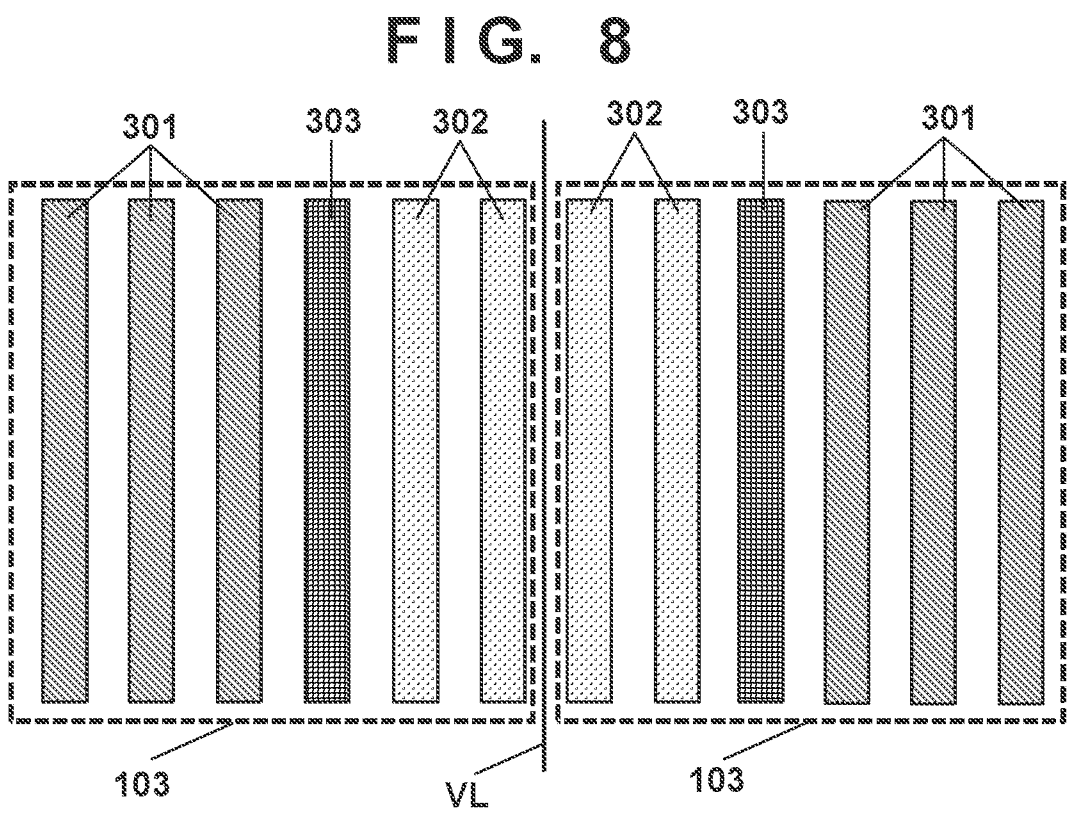
FIG. 8 is a plan view showing the arrangement of a plurality of column signal lines in each column according to the fourth embodiment.

With reference to FIG. 8, the arrangement of a photoelectric conversion device 100 according to the fourth embodiment will be described below. The fourth embodiment is an improvement of the third embodiment, and matters not mentioned as the fourth embodiment can follow the third embodiment. FIG. 8 exemplarily shows the arrangement of a plurality of column signal lines 103 in each column of the photoelectric conversion device 100 according to the fourth embodiment.

In the fourth embodiment, in two columns adjacent to each other, the arrangement of a plurality of first signal lines 301 and a plurality of second signal lines 302 is line-symmetric with respect to a virtual line VL extending in the column direction between the two columns. That is, in the fourth embodiment, the plurality of second signal lines 302 in a given column are adjacent to the plurality of second signal lines 302 in an adjacent column without intervening the first signal line 301. Similarly, in the fourth embodiment, in two columns adjacent to each other, the plurality of first signal lines 301 in a given column (the right column in FIG. 8) are adjacent to the plurality of first signal lines 301 in the adjacent column (a column (not shown) on the right of the right column in FIG. 8) without intervening the second signal line 302.

In addition, in the fourth embodiment, no electric conductor (corresponding to the second electric conductor 303' in the third embodiment) is arranged between two columns, that is, between the second signal line 302 in the column on the left of the virtual line VL and the second signal line 302 in the column on the right of the virtual line VL in FIG. 8. However, in the fourth embodiment, the second signal lines 302 or the first signal lines 301 are adjacent to each other between two columns. That is, the second signal lines 302 for reading out sensing image signals or the first signal lines 301 for reading out display image signals are adjacent to each other between two columns. Hence, in the fourth embodiment, a problem of crosstalk between two columns is allowable. The arrangement in which no electric conductor is arranged between two columns is effective in reducing the entire area of the photoelectric conversion device 100.

Figure 9:
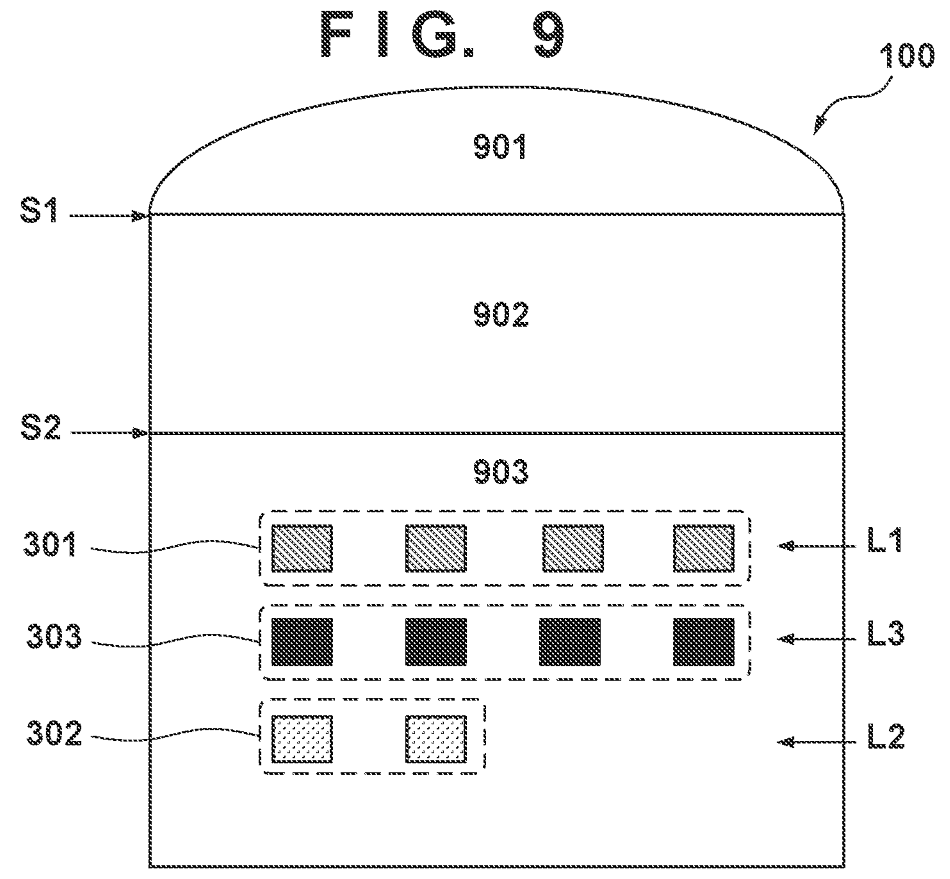
FIG. 9 is a sectional view showing the arrangement of a plurality of column signal lines in each column according to the fifth embodiment.

With reference to FIG. 9, the arrangement of a photoelectric conversion device 100 according to the fifth embodiment will be described below. Matters not mentioned as the fifth embodiment can follow the first embodiment. FIG. 9 exemplarily shows the arrangement of a plurality of column signal lines 103 in each column of the photoelectric conversion device 100 according to the fifth embodiment.

Each pixel 101 can include a photoelectric conversion unit (for example, a photodiode), a transistor, a floating diffusion, and the like. The photoelectric conversion unit, the source and drain of the transistor, the floating diffusion, and the like are arranged in a semiconductor layer 902. A microlens 901 can be arranged on the side of a first surface S1 of the semiconductor layer 902. A wiring structure 903 can be arranged on the side of a second surface S2 of the semiconductor layer 902. In the wiring structure 903, a plurality of first signal lines 301, a plurality of second signal lines 302, and one or a plurality of electric conductors 303 can be arranged. The plurality of first signal lines 301, the plurality of second signal lines 302, and the one or plurality of electric conductors 303 can be electrically insulated from each other by an interlayer insulating film. The plurality of first signal lines 301 are arranged in a first wiring layer L1, the plurality of second signal lines 302 are arranged in a second wiring layer L2, and the one or plurality of electric conductors 303 are arranged between the first wiring layer L1 and the second wiring layer L2. One electric conductor 303 in the third wiring layer L3 may be arranged between the first wiring layer L1 and the second wiring layer L2.

Figure 10:
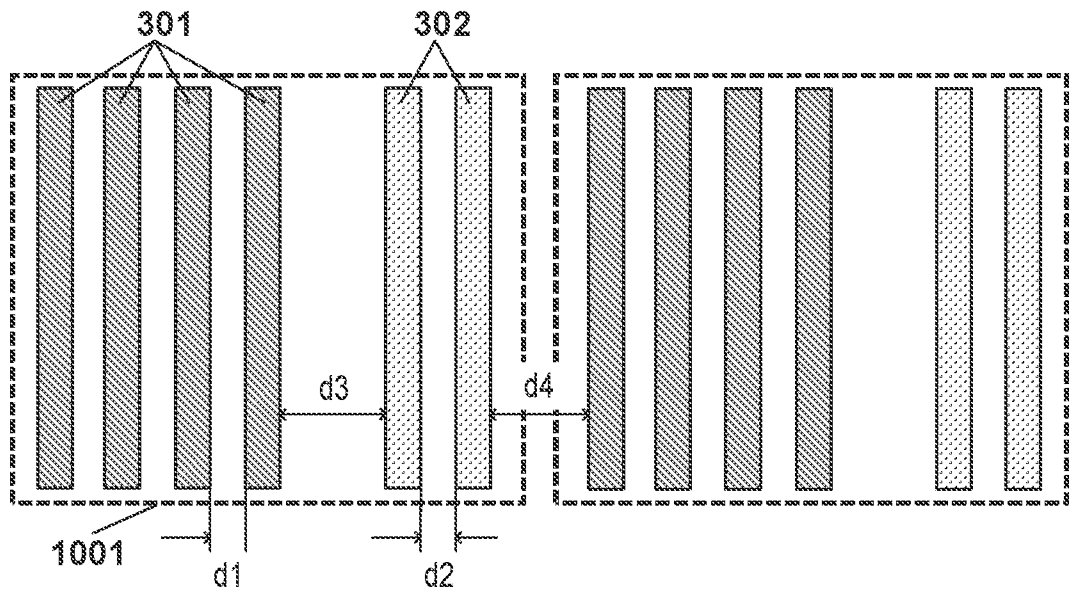
FIG. 10 is a plan view showing the arrangement of a photoelectric conversion device according to the sixth embodiment.

With reference to FIG. 10, the arrangement of a photoelectric conversion device 100 according to the sixth embodiment will be described below. Matters not mentioned as the sixth embodiment can follow the first embodiment. FIG. 10 exemplarily shows the arrangement of a plurality of column signal lines 103 in each column of the photoelectric conversion device 100 according to the sixth embodiment.

The photoelectric conversion device 100 according to the sixth embodiment can have an arrangement obtained by, for example, removing the electric conductor 303 from the photoelectric conversion device 100 according to the first embodiment. The photoelectric conversion device 100 according to the sixth embodiment can operate similarly to the photoelectric conversion device 100 according to the first embodiment. A shortest distance d3 between a first structure formed by a plurality of first signal lines 301 and a second structure formed by a plurality of second signal lines 302 is larger than a shortest mutual distance d1 between the plurality of first signal lines 301 and a shortest mutual distance d2 between the plurality of second signal lines 302. Such an arrangement is advantageous in reducing crosstalk between the plurality of first signal lines 301 and the plurality of second signal lines 302, particularly, between the first signal line 301 and the second signal line 302 adjacent to each other.

Figure 11:
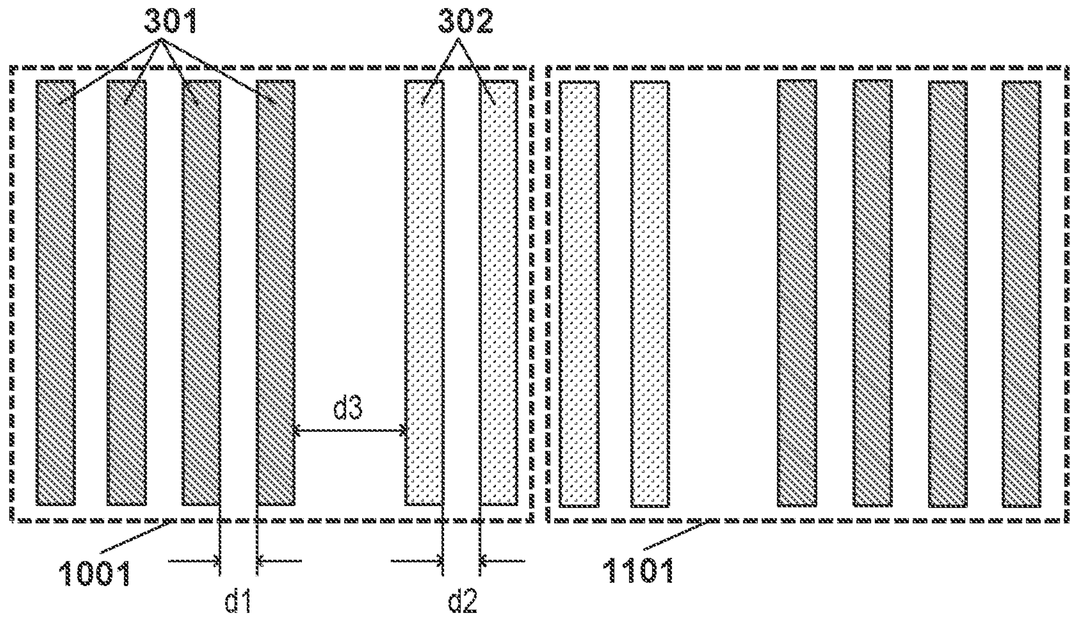
FIG. 11 is a plan view showing the arrangement of a photoelectric conversion device according to the seventh embodiment.

With reference to FIG. 11, the arrangement of a photoelectric conversion device 100 according to the seventh embodiment will be described below. Matters not mentioned as the seventh embodiment can follow the second embodiment. FIG. 11 exemplarily shows the arrangement of a plurality of column signal lines 103 in each column of the photoelectric conversion device 100 according to the seventh embodiment.

The photoelectric conversion device 100 according to the seventh embodiment can have an arrangement obtained by, for example, removing the electric conductor 303 from the photoelectric conversion device 100 according to the second embodiment. The photoelectric conversion device 100 according to the seventh embodiment can operate similarly to the photoelectric conversion device 100 according to the second embodiment. A shortest distance d3 between a first structure formed by a plurality of first signal lines 301 and a second structure formed by a plurality of second signal lines 302 is larger than a shortest mutual distance d1 between the plurality of first signal lines 301 and a shortest mutual distance d2 between the plurality of second signal lines 302. Such an arrangement is advantageous in reducing crosstalk between the plurality of first signal lines 301 and the plurality of second signal lines 302, particularly, between the first signal line 301 and the second signal line 302 adjacent to each other.

An example of a photoelectric conversion system using the photoelectric conversion device according to each embodiment described above will be described below.

Figure 12:
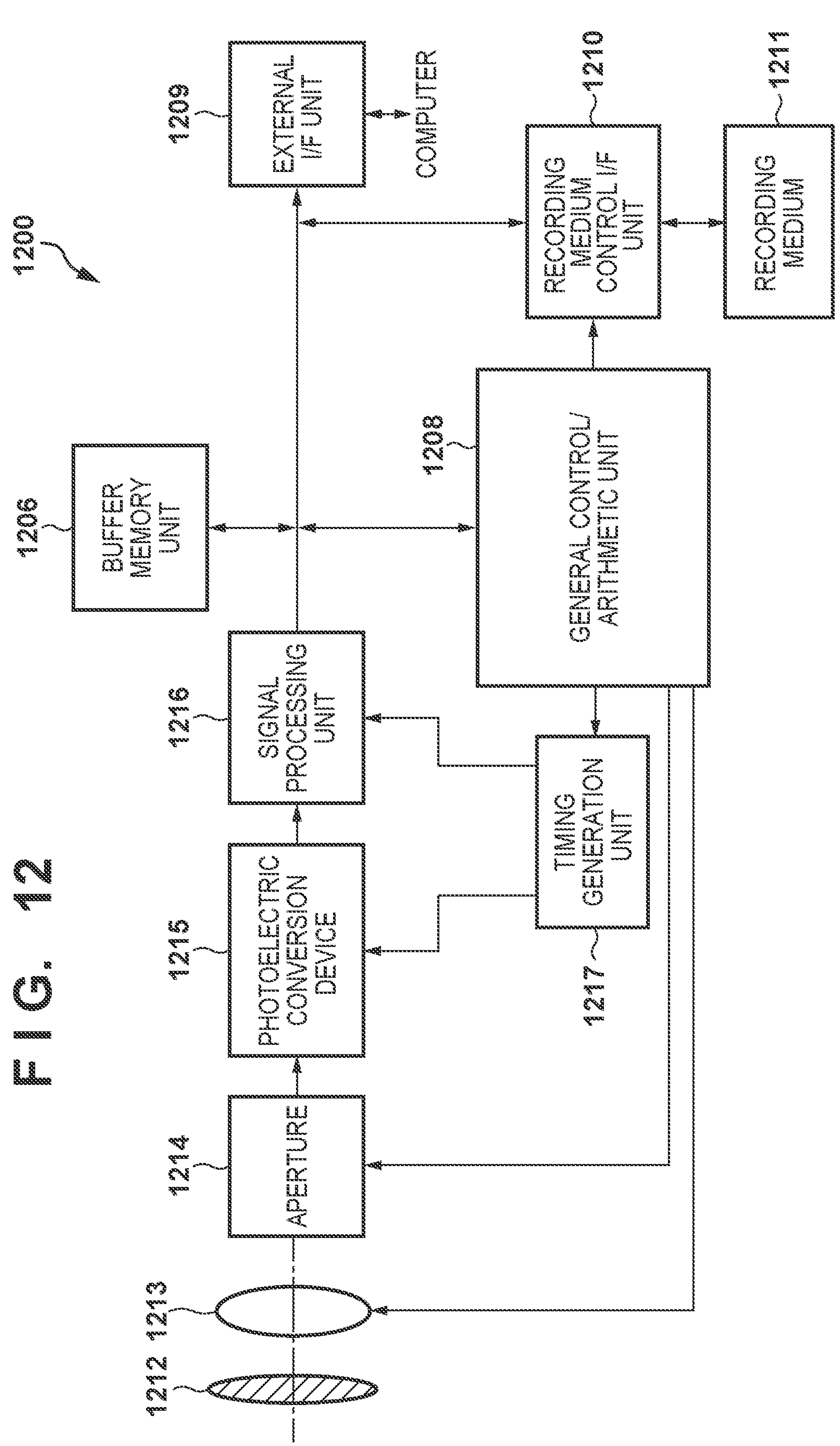
FIG. 12 is a view exemplarily showing the arrangement of a photoelectric conversion system.

FIG. 12 is a block diagram showing the arrangement of a photoelectric conversion system 1200 according to this embodiment. The photoelectric conversion system 1200 according to this embodiment includes a photoelectric conversion device 1215. Here, any of the photoelectric conversion devices 100 described in the above-described embodiments can be applied to the photoelectric conversion device 1215. The photoelectric conversion system 1200 can be used as, for example, an image sensing system. Practical examples of the image sensing system are a digital still camera, a digital camcorder, and a monitoring camera. FIG. 12 shows an example of a digital still camera as the photoelectric conversion system 1200.

The photoelectric conversion system 1200 shown in FIG. 12 includes the photoelectric conversion device 1215, a lens 1213 for forming an optical image of an object on the photoelectric conversion device 1215, an aperture 1214 for changing the amount of light passing through the lens 1213, and a barrier 1212 for protecting the lens 1213. The lens 1213 and the aperture 1214 form an optical system for concentrating light to the photoelectric conversion device 1215.

The photoelectric conversion system 1200 includes a signal processor 1216 for processing an output signal output from the photoelectric conversion device 1215. The signal processor 1216 performs an operation of signal processing of performing various kinds of correction and compression for an input signal, as needed, thereby outputting the resultant signal. The photoelectric conversion system 1200 further includes a buffer memory unit 1206 for temporarily storing image data and an external interface unit (external I/F unit) 1209 for communicating with an external computer or the like. Furthermore, the photoelectric conversion system 1200 includes a recording medium 1211 such as a semiconductor memory for recording or reading out image sensing data, and a recording medium control interface unit (recording medium control I/F unit) 1210 for performing a recording or reading operation in or from the recording medium 1211. The recording medium 1211 may be incorporated in the photoelectric conversion system 1200 or may be detachable. In addition, communication with the recording medium 1211 from the recording medium control I/F unit 1210 or communication from the external I/F unit 1209 may be performed wirelessly.

Furthermore, the photoelectric conversion system 1200 includes a general control/arithmetic unit 1208 that performs various kinds of arithmetic operations and controls the entire digital still camera, and a timing generation unit 1217 that outputs various kinds of timing signals to the photoelectric conversion device 1215 and the signal processor 1216. Here, the timing signal and the like may be input from the outside, and the photoelectric conversion system 1200 need only include at least the photoelectric conversion device 1215 and the signal processor 1216 that processes an output signal output from the photoelectric conversion device 1215. As described in the fourth embodiment, the timing generation unit 1217 may be incorporated in the photoelectric conversion device. The general control/arithmetic unit 1208 and the timing generation unit 1217 may be configured to perform some or all of the control functions of the photoelectric conversion device 1215.

The photoelectric conversion device 1215 outputs an image signal to the signal processor 1216. The signal processor 1216 performs predetermined signal processing for the image signal output from the photoelectric conversion device 1215 and outputs image data. The signal processor 1216 also generates an image using the image signal. Furthermore, the signal processor 1216 may perform distance measurement calculation for the signal output from the photoelectric conversion device 1215. Note that the signal processor 1216 and the timing generation unit 1217 may be incorporated in the photoelectric conversion device. That is, each of the signal processor 1216 and the timing generation unit 1217 may be provided on a substrate on which pixels are arranged or may be provided on another substrate. An image sensing system capable of acquiring a higher-quality image can be implemented by forming an image sensing system using the photoelectric conversion device of each of the above-described embodiments.

Figure 13B:
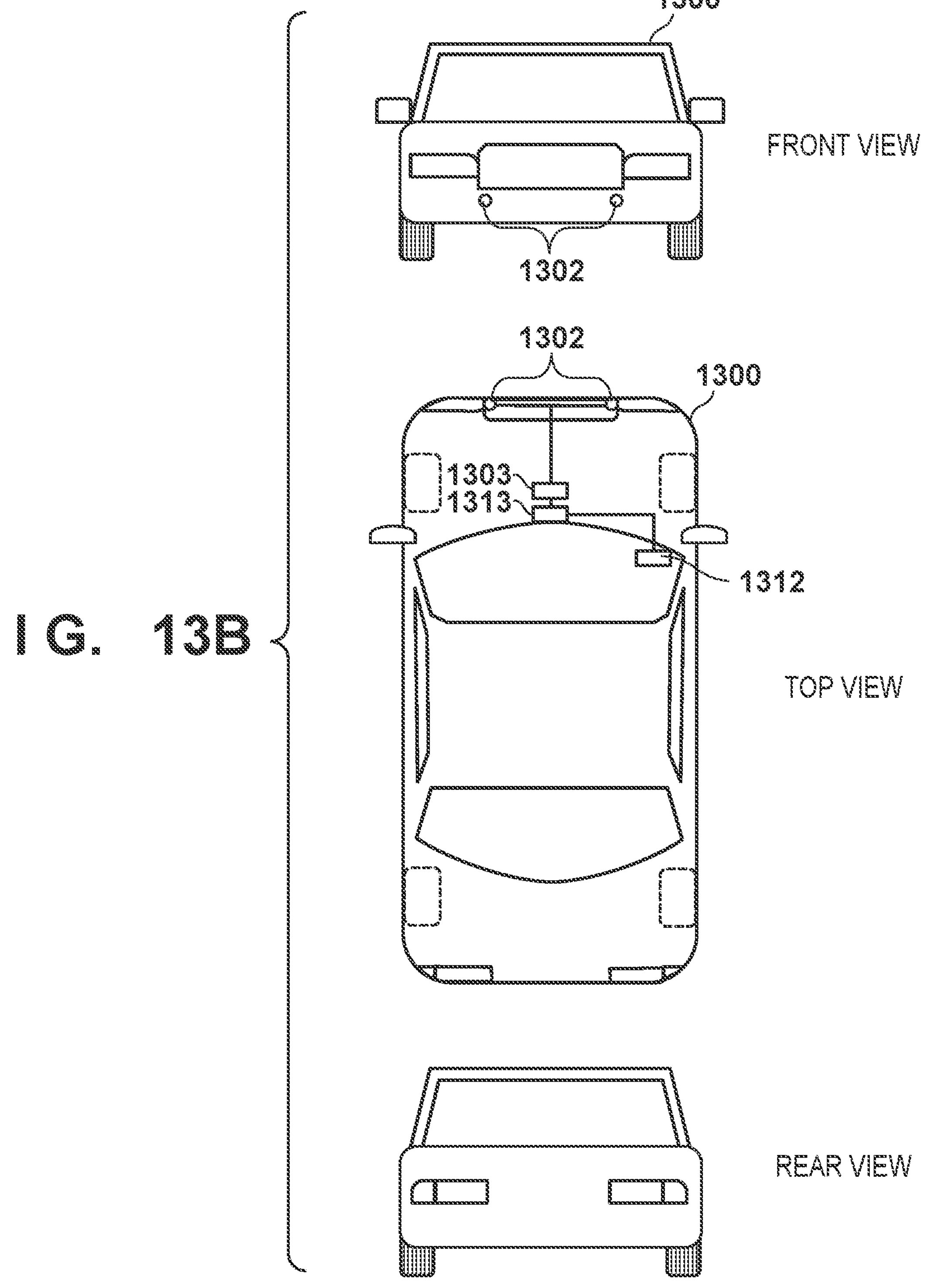

A photoelectric conversion system and a moving body according to this embodiment will be described with reference to FIGS. 13A and 13B. FIGS. 13A and 13B are schematic views showing an arrangement example of the photoelectric conversion system and an arrangement example of the moving body, respectively, according to this embodiment. In this embodiment, an example of an in-vehicle camera will be described as the photoelectric conversion system.

FIGS. 13A and 13B show examples of a vehicle system and a photoelectric conversion system that is incorporated in the vehicle system and performs image sensing. A photoelectric conversion system 1301 includes a photoelectric conversion device 1302, an image preprocessor 1315, an integrated circuit 1303, and an optical system 1314. The optical system 1314 forms an optical image of an object on the photoelectric conversion device 1302. The photoelectric conversion device 1302 converts, into an electrical signal, the optical image of the object formed by the optical system 1314. The photoelectric conversion device 1302 is the photoelectric conversion device 100 according to any one of the above-described embodiments. The image preprocessor 1315 performs predetermined signal processing for the signal output from the photoelectric conversion device 1302. The function of the image preprocessor 1315 may be incorporated in the photoelectric conversion device 1302. In the photoelectric conversion system 1301, at least two sets of the optical systems 1314, the photoelectric conversion devices 1302, and the image preprocessors 1315 are arranged, and an output from the image preprocessor 1315 of each set is input to the integrated circuit 1303.

The integrated circuit 1303 is an image sensing system application specific integrated circuit, and includes an image processor 1304 with a memory 1305, an optical distance measurement unit 1306, a distance measurement calculation unit 1307, an object recognition unit 1308, and an abnormality detection unit 1309. The image processor 1304 performs image processing such as development processing and defect correction for the output signal from each image preprocessor 1315. The memory 1305 temporarily stores a captured image, and stores the position of a defect in the captured image. The optical distance measurement unit 1306 performs focusing or distance measurement of an object. The distance measurement calculation unit 1307 calculates distance measurement information from a plurality of image data acquired by the plurality of photoelectric conversion devices 1302. The object recognition unit 1308 recognizes objects such as a vehicle, a road, a road sign, and a person. Upon detecting an abnormality of the photoelectric conversion device 1302, the abnormality detection unit 1309 notifies a main control unit 1313 of the abnormality.

The integrated circuit 1303 may be implemented by dedicated hardware, a software module, or a combination thereof. Alternatively, the integrated circuit 1303 may be implemented by a Field Programmable Gate Array (FPGA), an Application Specific Integrated Circuit (ASIC), or a combination thereof.

The main control unit 1313 comprehensively controls the operations of the photoelectric conversion system 1301, vehicle sensors 1310, a control unit 1320, and the like. A method in which the photoelectric conversion system 1301, the vehicle sensors 1310, and the control unit 1320 each individually include a communication interface and transmit/receive control signals via a communication network (for example, CAN standards) may be adopted without providing the main control unit 1313.

The integrated circuit 1303 has a function of transmitting a control signal or a setting value to each photoelectric conversion device 1302 by receiving the control signal from the main control unit 1313 or by its own control unit.

The photoelectric conversion system 1301 is connected to the vehicle sensors 1310 and can detect the traveling state of the self-vehicle such as the vehicle speed, the yaw rate, and the steering angle, the external environment of the self-vehicle, and the states of other vehicles and obstacles. The vehicle sensors 1310 also serve as a distance information acquisition unit that acquires distance information to a target object. Furthermore, the photoelectric conversion system 1301 is connected to a driving support control unit 1311 that performs various driving support operations such as automatic steering, adaptive cruise control, and anti-collision function. More specifically, with respect to a collision determination function, based on the detection results from the photoelectric conversion system 1301 and the vehicle sensors 1310, a collision with another vehicle or an obstacle is estimated or the presence/absence of a collision is determined. This performs control to avoid a collision when the collision is estimated or activates a safety apparatus at the time of a collision.

Furthermore, the photoelectric conversion system 1301 is also connected to an alarm device 1312 that generates an alarm to the driver based on the determination result of a collision determination unit. For example, if the determination result of the collision determination unit indicates that the possibility of a collision is high, the main control unit 1313 performs vehicle control to avoid a collision or reduce damage by braking, releasing the accelerator pedal, or suppressing the engine output. The alarm device 1312 sounds an alarm such as a sound, displays alarm information on the screen of a display unit such as a car navigation system or a meter panel, applies a vibration to the seat belt or a steering wheel, thereby giving an alarm to the user.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-059094, filed Mar. 31, 2023, which is hereby incorporated by reference herein in its entirety.

What is claimed is:

1. A photoelectric conversion device comprising a plurality of pixels arranged so as to form a plurality of rows and a plurality of columns, a plurality of column signal lines, and a read circuit configured to read out signals from the plurality of pixels via the plurality of column signal lines, wherein the plurality of column signal lines include a plurality of first signal lines and a plurality of second signal lines for each of the plurality of columns, the plurality of rows include a plurality of first group rows forming a first group, and a plurality of second group rows forming a second group, the read circuit performs first vertical scanning of reading out signals of pixels in the plurality of first group rows via the plurality of first signal lines in each column, and second vertical scanning of reading out signals of pixels in the plurality of second group rows via the plurality of second signal lines in each column, and the second vertical scanning is performed in a period from a start of the first vertical scanning to an end of the first vertical scanning, an electric conductor, which is electrically connected to none of the plurality of pixels in the period from the start of the first vertical scanning to the end of the first vertical scanning, is arranged between the plurality of first signal lines and the plurality of second signal lines, in a first mode, the electric conductor in each column is used as a third signal line used by the read circuit to read out signals of pixels in a row different from the plurality of first group rows and the plurality of second group rows, and in a second mode, the electric conductor in each column is used as a shield between the plurality of first signal lines and the plurality of second signal lines.

2. The device according to claim 1, wherein in the period, a fixed potential is supplied to the electric conductor.

3. The device according to claim 1, further comprising a dummy pixel from which a signal is not read out in the period, wherein the electric conductor is electrically connected to the dummy pixel in the period.

4. The device according to claim 1, wherein a second electric conductor is arranged between two columns adjacent to each other.

5. The device according to claim 1, wherein between two columns adjacent to each other, an arrangement of the plurality of first signal lines and the plurality of second signal lines is line-symmetric with respect to a virtual line extending in a column direction between the two columns.

6. The device according to claim 5, wherein no electric conductor is arranged between the two columns.

7. The device according to claim 1, wherein in the second mode, the read circuit performs the first vertical scanning, and performs the second vertical scanning in the period from the start of the first vertical scanning to the end of the first vertical scanning.

8. The device according to claim 1, wherein in the second mode, a fixed potential is supplied to the electric conductor.

9. The device according to claim 1, wherein the plurality of first signal lines and the plurality of second signal lines are arranged in the same wiring layer.

10. The device according to claim 1, wherein the plurality of first signal lines are arranged in a first wiring layer, the plurality of second signal lines are arranged in a second wiring layer, and the electric conductor is arranged between the first wiring layer and the second wiring layer.

11. A photoelectric conversion system comprising:

a photoelectric conversion device defined in claim 1; and a signal processor configured to process a signal output by the photoelectric conversion device.

12. A moving body comprising a photoelectric conversion device defined in claim 1, and a distance information acquirer configured to acquire distance information to a target object from distance measurement information based on a signal from the photoelectric conversion device, the moving body further comprising a controller configured to control the moving body based on the distance information.

13. A photoelectric conversion device comprising a plurality of pixels arranged so as to form a plurality of rows and a plurality of columns, a plurality of column signal lines, and a read circuit configured to read out signals from the plurality of pixels via the plurality of column signal lines, wherein the plurality of column signal lines include a plurality of first signal lines, a plurality of second signal lines, and a third signal line for each of the plurality of columns, the plurality of rows include a plurality of first group rows forming a first group, and a plurality of second group rows forming a second group, and the third signal line is arranged between the plurality of first signal lines and the plurality of second signal lines, is used by the read circuit to read out signals from at least some of the plurality of pixels in a vertical scanning period in a first mode, and is electrically connected to none of the plurality of pixels in a vertical scanning period in a second mode.

14. A photoelectric conversion system comprising:

a photoelectric conversion device defined in claim 13; and a signal processor configured to process a signal output by the photoelectric conversion device.

15. A moving body comprising a photoelectric conversion device defined in claim 13, and a distance information acquirer configured to acquire distance information to a target object from distance measurement information based on a signal from the photoelectric conversion device, the moving body further comprising a controller configured to control the moving body based on the distance information.

* * * * *